US012689375B2

(12) United States Patent
Lin et al.

(10) Patent No.: US 12,689,375 B2
(45) Date of Patent: Jul. 21, 2026

(54) PIPELINE CIRCUIT AND PIPELINE OPERATING METHOD

(71) Applicant: NEUCHIPS CORPORATION, Hsinchu City (TW)

(72) Inventors: Chiung-Liang Lin, Taichung City (TW); Chia Chun Chiang, New Taipei City (TW)

(73) Assignee: NEUCHIPS CORPORATION, Hsinchu City (TW)

( * ) Notice: Subject to any disclaimer, the term of this patent is extended or adjusted under 35 U.S.C. 154(b) by 122 days.

(21) Appl. No.: 18/800,151

(22) Filed: Aug. 12, 2024

(65) Prior Publication Data

US 2026/0012178 A1      Jan. 8, 2026

(30) Foreign Application Priority Data

Jul. 5, 2024      (TW) ................................. 113125274

(51) Int. Cl.
*H03K 19/00*          (2006.01)
*G06F 1/324*          (2019.01)

(52) U.S. Cl.
CPC ......... *H03K 19/0016* (2013.01); *G06F 1/324* (2013.01)

(58) Field of Classification Search
CPC .......... H03K 19/0016; H03K 19/01728; G06F 1/324; G06F 9/3867; G06F 9/38699; G06F 2117/04; G06F 9/3893; G06F 7/5443
See application file for complete search history.

(56) References Cited

U.S. PATENT DOCUMENTS

| | | | | |
|---|---|---|---|---|
| 7,945,765 B2 * | 5/2011 | Emma | ..................... | G06F 9/383 |
| | | | | 712/219 |
| 8,055,965 B2 * | 11/2011 | Kaneko | ..................... | G06F 1/32 |
| | | | | 714/731 |
| 9,172,379 B1 * | 10/2015 | How | ....................... | G06F 30/34 |
| 10,489,116 B1 * | 11/2019 | Esposito | ............. | G06F 15/7867 |
| 2003/0226000 A1 * | 12/2003 | Rhoades | ............. | G06F 9/30189 |
| | | | | 712/E9.035 |
| 2004/0068640 A1 * | 4/2004 | Jacobson | .............. | G06F 1/3203 |
| | | | | 712/E9.063 |
| 2008/0046771 A1 * | 2/2008 | Hsu | ........................... | G06F 1/10 |
| | | | | 713/401 |
| 2009/0044033 A1 * | 2/2009 | Allen | .................... | G06F 30/327 |
| | | | | 713/322 |
| 2011/0080916 A1 | 4/2011 | Davies et al. | | |

(Continued)

FOREIGN PATENT DOCUMENTS

| | | |
|---|---|---|
| CN | 103236790 | 8/2013 |
| TW | 360798 | 6/1999 |
| TW | 202110089 | 3/2021 |

OTHER PUBLICATIONS

"Office Action of Taiwan Counterpart Application", issued on Feb. 17, 2025, p. 1-p. 6.

*Primary Examiner* — Jason M Crawford
(74) *Attorney, Agent, or Firm* — JCIPRNET

(57)          ABSTRACT

A pipeline circuit and a pipeline operating method are provided. The pipeline circuit includes a gating circuit that is configured to receive an input signal at an input end and selectively output the input signal as an output signal at an output end. In a first mode, the gating circuit receives the input signal that has been gated to output as the output signal. In a second mode, the gating circuit receives the input signal to output as the output signal.

7 Claims, 6 Drawing Sheets

(56) References Cited

U.S. PATENT DOCUMENTS

| 2015/0048876 A1* | 2/2015 | Kim | .................. | H03K 19/0013 |
| | | | | 327/394 |
| 2026/0012178 A1* | 1/2026 | Lin | ........................ | G06F 1/324 |

* cited by examiner

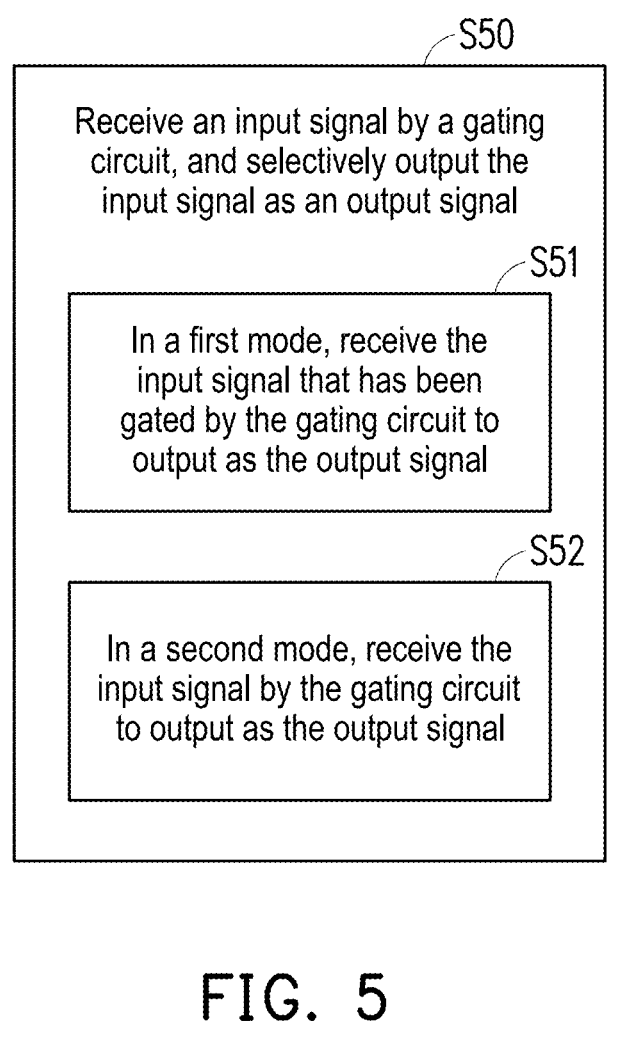

S50

Receive an input signal by a gating circuit, and selectively output the input signal as an output signal

S51

In a first mode, receive the input signal that has been gated by the gating circuit to output as the output signal

S52

In a second mode, receive the input signal by the gating circuit to output as the output signal

FIG. 5

PIPELINE CIRCUIT AND PIPELINE OPERATING METHOD

CROSS-REFERENCE TO RELATED APPLICATION

This application claims the priority benefit of Taiwan application serial no. 113125274, filed on Jul. 5, 2024. The entirety of the above-mentioned patent application is hereby incorporated by reference herein and made a part of this specification.

BACKGROUND

Technical Field

The disclosure relates to a circuit and a method, and in particular to a pipeline circuit and a pipeline operating method.

Description of Related Art

Pipeline design is a common circuit structure in current digital circuits. However, as circuit design gets more and more complex, and operation speed gets faster and faster, how to meet a low power consumption demand in a pipeline design architecture has become one of the important issues that need to be solved in digital circuit design today.

SUMMARY

The disclosure provides a pipeline circuit and a pipeline operating method that can meet a low power consumption demand.

The pipeline circuit according to an embodiment of the disclosure includes a gating circuit that is configured to receive an input signal at an input end and selectively output the input signal as an output signal at an output end. In a first mode, the gating circuit receives the input signal that has been gated to output as the output signal. In a second mode, the gating circuit receives the input signal to output as the output signal.

The pipeline operating method according to an embodiment of the disclosure includes: receiving an input signal by a gating circuit and selectively outputting the input signal as an output signal. In a first mode, the input signal that has been gated is received by the gating circuit to output as the output signal, and in a second mode, the input signal is received by the gating circuit to output as the output signal.

Based on the above, the pipeline circuit and the pipeline operating method of the disclosure can provide a variety of operation modes in a pipeline design structure, and meet a low power consumption demand at the same time.

BRIEF DESCRIPTION OF THE DRAWINGS

FIG. 5 is a flow chart of a pipeline operating method according to an embodiment of the disclosure.

DESCRIPTION OF THE EMBODIMENTS

Generally speaking, in the process of circuit design, especially digital circuits, in order to speed up an overall computation speed, an entire circuit may be segmented into many stages of series circuits. Each stage of circuits may have similar computation time, and perform gating through, for example, a gating circuit of a register. In this way, each stage of the entire circuit may be controlled by a same clock signal, and may synchronously transmit a computation result to a next stage at an end of each clock cycle, so that a pipeline design of the entire circuit synchronously performing computation is achieved. Pipeline design may achieve advantages such as a higher hardware utilization rate, a faster computation speed, and a larger signal throughput in some conditions.

Figure 1:
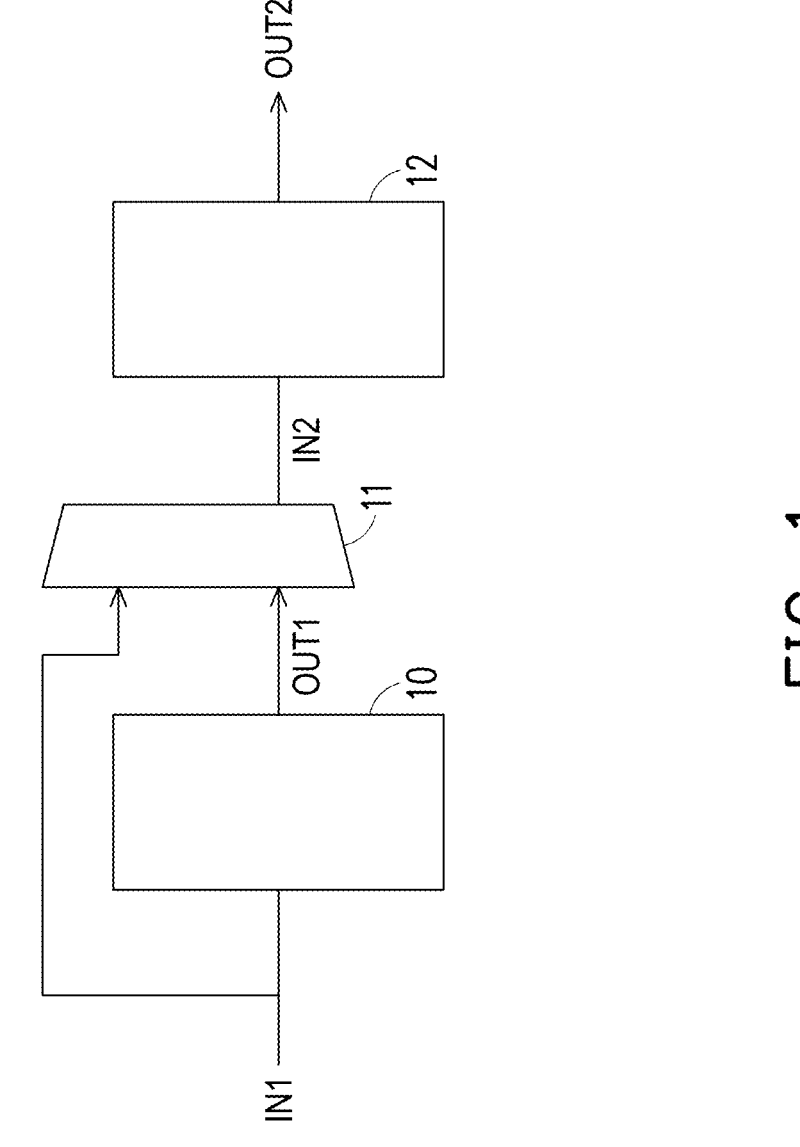
FIG. 1 is a circuit block diagram of a pipeline circuit 1 according to an embodiment of the disclosure.

FIG. 1 is a circuit block diagram of a pipeline circuit 1 according to an embodiment of the disclosure. As shown in FIG. 1, a pipeline circuit 1 includes gating circuits 10 and 12, and a select circuit 11.

In the embodiment, the pipeline circuit 1 may receive an input signal IN, and selectively provide to the gating circuit 12 in different signal paths through an operation of the select circuit 11, and output as an output signal OUT through a control of the gating circuit 12. Specifically, the pipeline circuit 1 may be operated in a first mode or a second mode. When the pipeline circuit 1 is operated in the first mode, an input signal IN1 may be output as an output signal OUT1 through a control of the gating circuit 10, and output as an input signal IN2 through a selection of the select circuit 11. Finally, the input signal IN2 generated by the input signal IN that is gated may be output as the output signal OUT2 by the control of the gating circuit 12. When the pipeline circuit 1 is operated in the second mode, the input signal IN1 may be directly provided to an input end of the select circuit 11 without being gated through the selection of the select circuit 11, and output to an output end of the select circuit 11 to be the input signal IN2 to be provided to the gating circuit 12 to allow the gating circuit 12 to output the input signal IN2 that is not delayed or gated by the gating circuit 10 as the output signal OUT2.

Specifically, the gating circuit 10 of the pipeline circuit 1 may be selectively bypassed by the select circuit 11 to allow the input signal IN1 to be input to the gating circuit 12 through different signal paths, so that there are different delay times.

Figure 2:
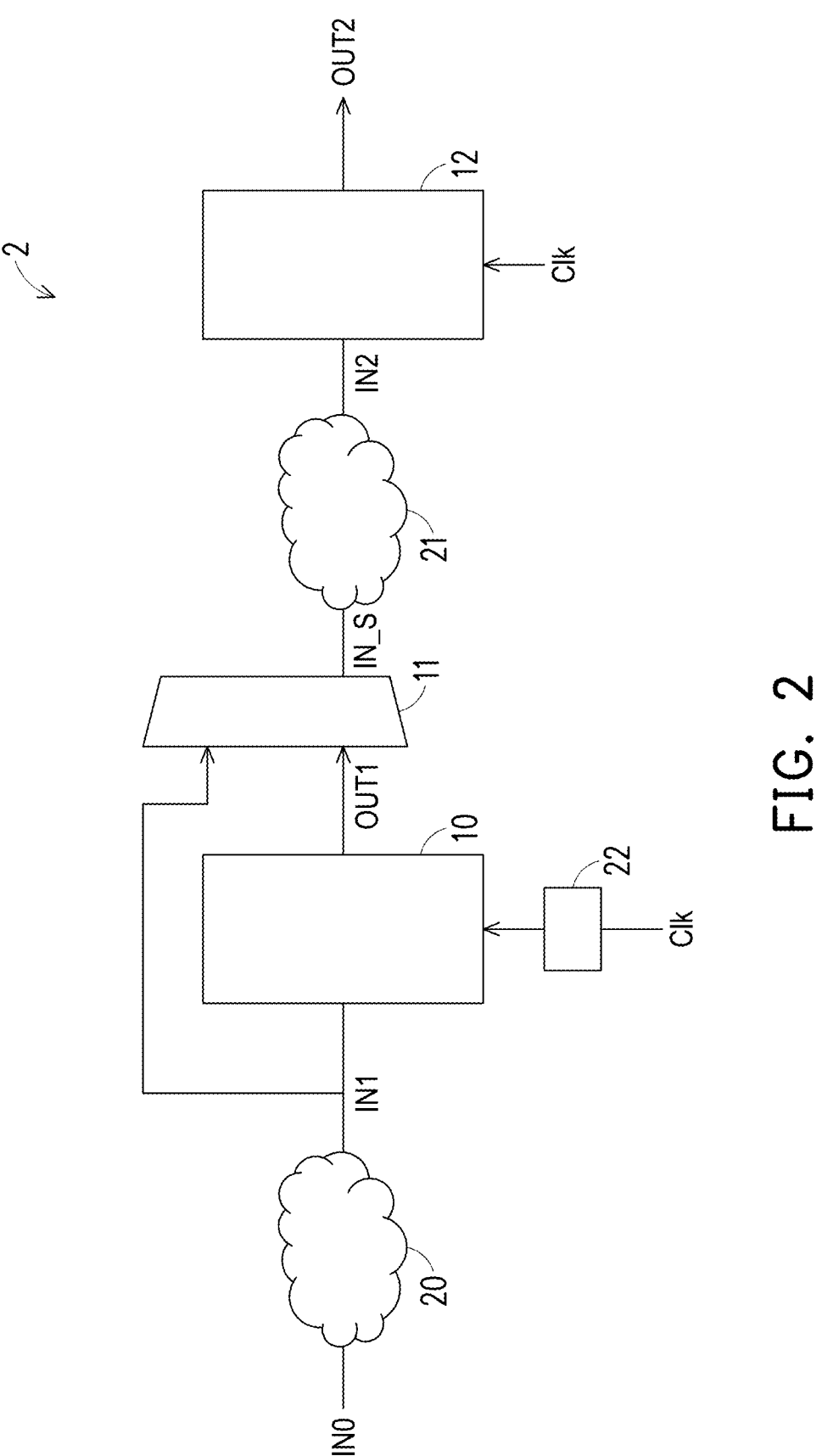
FIG. 2 is a circuit block diagram of a pipeline circuit 2 according to an embodiment of the disclosure.

FIG. 2 is a circuit block diagram of a pipeline circuit 2 according to an embodiment of the disclosure. The pipeline circuit 2 in FIG. 2 is similar to the pipeline circuit 1 in FIG. 1, so the same circuit structure is represented by the same reference numerals. Please refer to the foregoing relevant paragraphs to understand the operation content, which will not be described again here.

In addition to the same gating circuits 10 and 12, and the same select circuit 11, the pipeline circuit 2 further includes computing circuits 20 and 21, and a gating circuit 22. In detail, the pipeline circuit 2 may be applied in an electronic system. The computing circuits 20 and 21 are, for example, circuits divided from the electronic system to perform computation, and have similar or about the same computing or delay time. The gating circuits 10 and 12 in the pipeline circuit 2 may perform gating for each stage of the pipeline circuit according to a trigger of a clock signal Clk to implement a pipeline operation of the electronic system.

In some embodiments, the gating circuits 10 or 12 may be, for example, a register. The select circuit 11 may be, for example, a multiplexer, an OR gate, or a circuit that implements a same function with a logic circuit. The computing circuit 20 and 21 may be, for example, digital circuits designed through full customization, hardware description language (HDL), or circuits generated by performing design and synthesis with any other design method of digital circuits known to persons skilled in the art.

In detail, the computing circuit 20 coupled to an input end of the gating circuit 10 is configured to receive an input signal IN1 generated after an input signal IN0 performed computation, and provide the input signal IN1 to the gating circuit 10 and the select circuit 11.

The gating circuit 10 has the input end that receives the input signal IN1, and selectively receives a drive of the clock signal Clk through the gating circuit 22 at a clock end to provide the input signal IN1 as the output signal OUT1 at an output end.

The gating circuit 22 coupled to the clock end of the gating circuit 10 is configured to provide the clock signal Clk to the gating circuit 10 to perform driving in the first mode, and block the clock signal Clk provided to the gating circuit 10 in the second mode.

The select circuit 11 is coupled between the gating circuit 10 and the gating circuit 12. The select circuit 11 has a first input end coupled to the input end of the gating circuit 10, a second input end coupled to the output end of the gating circuit 10, and an output end coupled to an input end of the gating circuit 12. The select circuit 11 is configured to couple the second input end of the select circuit 11 to the output end of the select circuit 11 in the first mode, and couple the first input end of the select circuit 11 to the output end of the select circuit 11 in the second mode.

The computing circuit 21 coupled between the output end of the select circuit 11 and the input end of the gating circuit 12 is configured to receive an input signal IN_S, and generate an input signal IN2 after performing computation to provide to the gating circuit 12.

The gating circuit 12 has the input end that receives the input signal IN2, and receives the drive of the clock signal Clk at the clock end to provide the input signal IN2 as the output signal OUT2 at the output end.

Figure 3A:
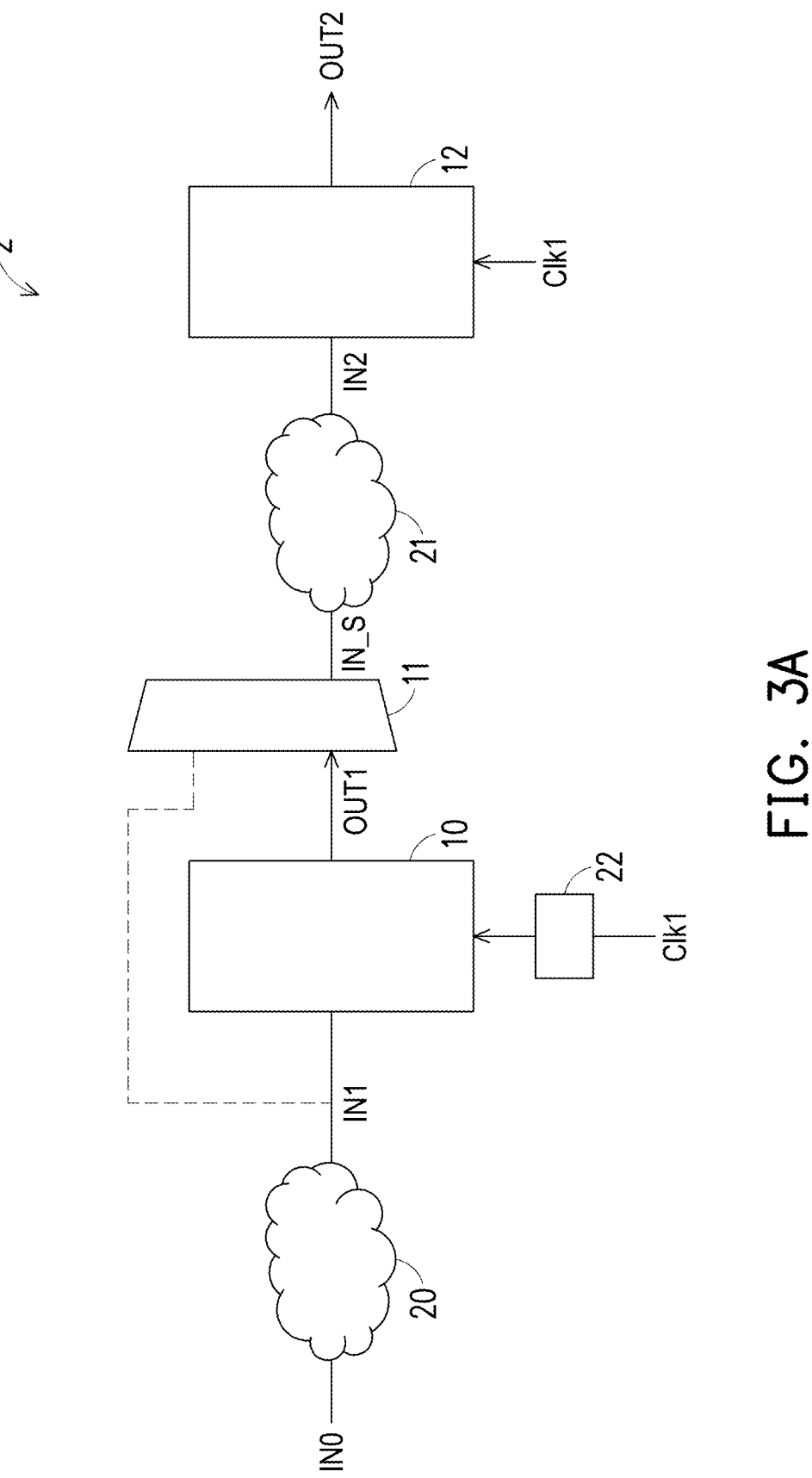
FIG. 3A is a schematic diagram of the pipeline circuit 2 of FIG. 2 operating in a first mode in an embodiment of the disclosure.

FIG. 3A is a schematic diagram of the pipeline circuit 2 of FIG. 2 operating in the first mode in an embodiment of the disclosure. As shown in FIG. 3A, when the pipeline circuit 2 operates in the first mode, the input signal IN1 generated by the input signal IN0 that has been computed by the computing circuit 20 may be output through a selection of the select circuit 11 as the signal IN_S through the gating circuit 10 and the select circuit 11. Further, the signal IN_S is output as the output signal OUT2 through a computation of the computing circuit 21, and the gating circuit 12.

In some respects, by participation of the gating circuits 10 and 12, an entire signal path from the input signal IN0 to the output signal OUT2 may be regarded as being split into two stages of the pipeline circuit allocated in two stages of the pipeline circuit. The gating circuits 10 and 12 may be synchronously triggered by the clock signal Clk1 and perform a downward transmission operation. The gating circuit 10 may output the input signal IN1 generated by a computation result of a pre-stage computing circuit 20 as the output signal OUT1. The gating circuit 12 may output the input signal IN2 generated by a computation result of a post-stage computing circuit 21 as the output signal OUT2. In some embodiments, an overall signal path delay from the input signal IN0 to the output signal OUT2 may be split into half or nearly half. The gating circuits 10 and 12 only need to respectively wait for a computation time of the computing circuits 20 and 21 to receive the computation result and perform a backward transmission operation. Therefore, the clock signal Clk1 may be possible to be set to operate at a higher or nearly twice a frequency to effectively improve a computation speed of the pipeline circuit 2.

Figure 3B:
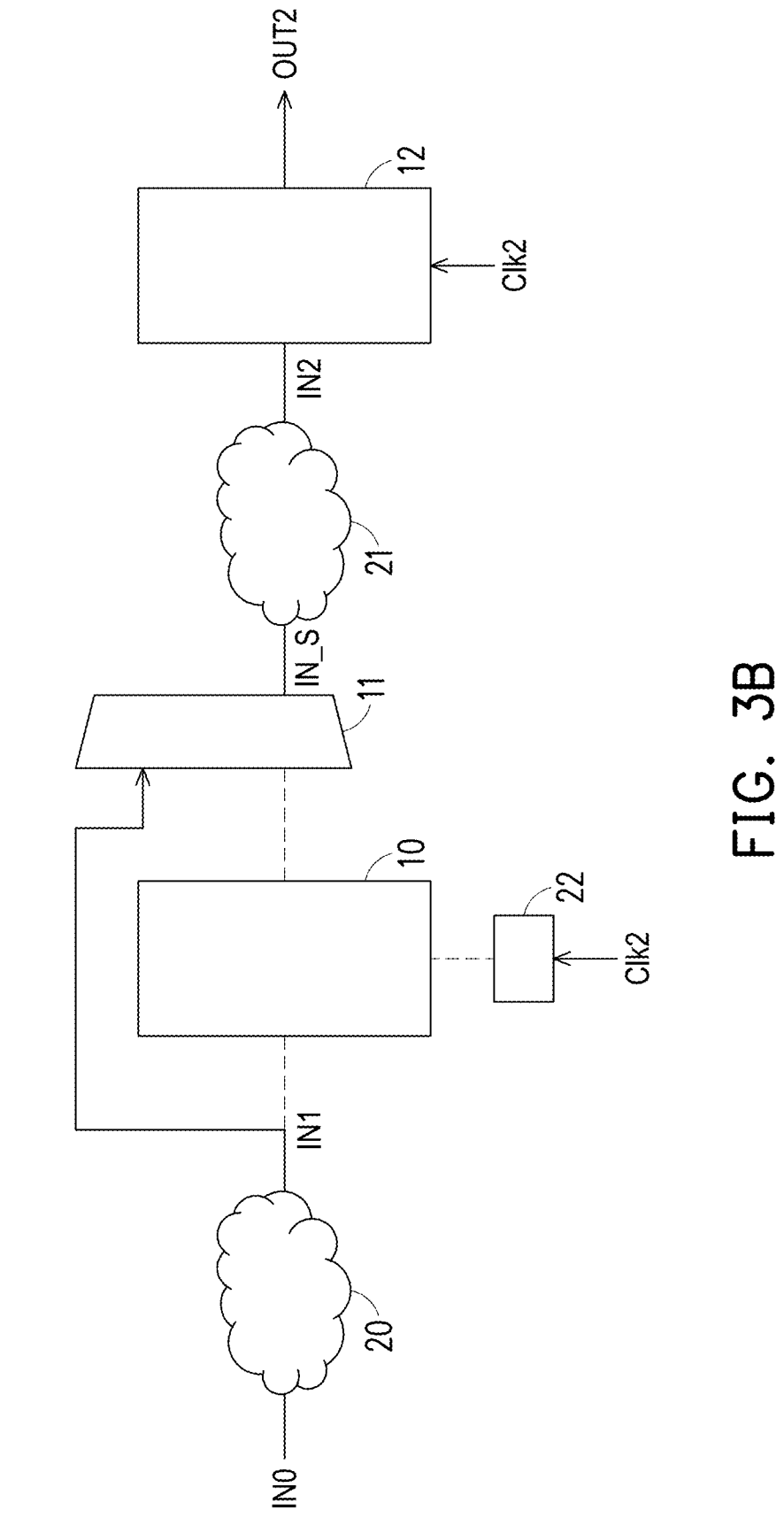
FIG. 3B is a schematic diagram of the pipeline circuit 2 of FIG. 2 operating in a second mode in an embodiment of the disclosure.

FIG. 3B is a schematic diagram of the pipeline circuit 2 of FIG. 2 operating in the second mode in an embodiment of the disclosure. As shown in FIG. 3B, when the pipeline circuit 2 operates in the second mode, the input signal IN1 generated by the input signal IN0 that has been computed by the computing circuit 20 may output through the selection of the select circuit 11 as the signal IN_S through the select circuit in a condition where the gating circuit 10 is bypassed. Further, the signal IN_S is output as the output signal OUT2 through the computation of the computing circuit 21, and the gating circuit 12. In the embodiment, the clock end of the bypassed gating circuit 10 may further be blocked by the gating circuit 22. The gating circuit 22 may be, for example, an AND gate, an NAND gate, a register, or other similar circuits.

In some aspects, by bypassing the gating circuit 10, the computing circuits 20 and 21 are commonly gated by the gating circuit 12 through an operation of the select circuit 11. The entire signal path from the input signal IN0 to the output signal OUT2 may therefore be regarded as only having one stage of the pipeline circuit. In detail, the input signal IN1 of the computation result of the pre-stage computing circuit 20 may be directly input to the select circuit 11, thereby inputting to the post-stage computing circuit 21. Finally, the gating circuit 12 outputs the input signal IN2 of the computation result of the post-stage computing circuit 21 as the output signal OUT2 according to the trigger of a clock signal Clk2. In some embodiments, in the second mode, an overall signal path delay from the input signal IN0 to the output signal OUT2 may not be split. The gating circuit 12 needs to wait for a computation time of both the computing circuits 20 and 21 to receive a computation result and perform a backward transmission operation. Therefore, the clock signal Clk2 may be possible to be set to operate at a lower or nearly half of a frequency. In some usage scenarios, when an electronic system to which the pipeline circuit 2 is applied has a looser timing constraint, and the pipeline circuit 2 may be driven through a lower frequency, part of the gating circuit is bypassed in a condition where the timing constraint is not violated to avoid generating signal toggling, so that power consumption is reduced.

For example, a delay of the computing circuit 20 or 21 is less than 0.5 nanoseconds. When operating in the first mode, the clock signal Clk1 may be, for example, set to 2 GHz to allow an overall signal delay from the input signal IN0 to the output signal OUT2 to be controlled to 1 nanosecond. On the other hand, when operating in the second mode, the clock signal Clk1 may be, for example, set to 1 GHz. In this way, when having the looser timing constraint, the overall signal delay from the input signal IN0 to the output signal OUT2 in the second mode is still controlled to 1 nanosecond as in the first mode but having the lower power consumption at the same time.

However, in some other embodiments, a selection of the clock signal Clk1 or Clk2 may further allow the input signal IN0 to the output signal OUT2 to have signal delays of different lengths in the first mode and the second mode.

Figure 4:
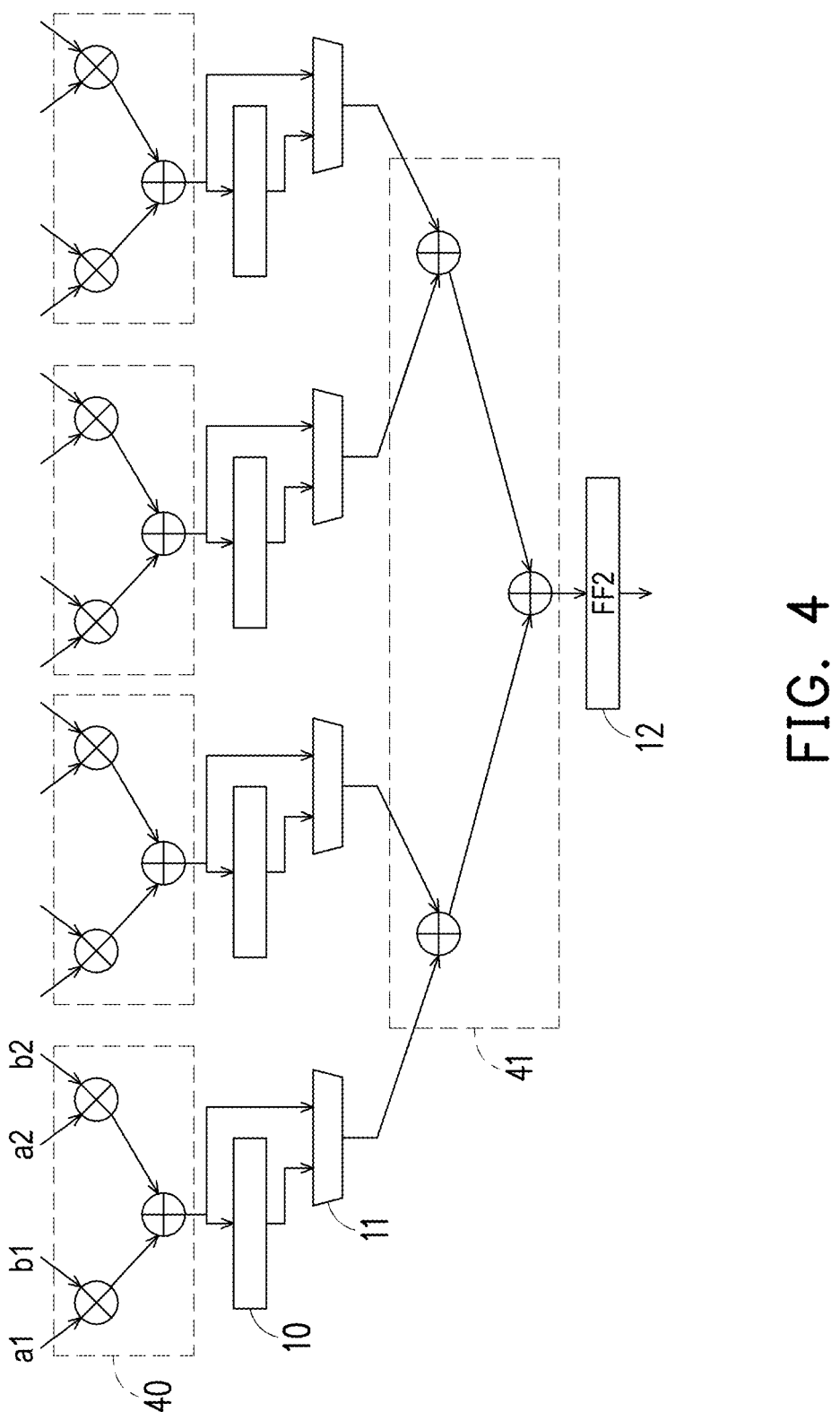
FIG. 4 is a circuit block diagram of a pipeline circuit 4 according to an embodiment of the disclosure.

FIG. 4 is a circuit block diagram of a pipeline circuit 4 according to an embodiment of the disclosure. The pipeline circuit 4 in FIG. 4 is similar to the pipeline circuit 1 in FIG. 1, so the same circuit structure is represented by the same reference numerals. Please refer to the foregoing relevant paragraphs to understand the operation content, which will not be described again here.

In the embodiment, the pipeline circuit 4 may be, for example, an inner product circuit. The pipeline circuit 4 includes multiple multiplier-accumulators (MAC) 40, multiple gating circuits 10, multiple select circuits 11, and an adder 41. Taking the leftmost multiplier-accumulator 40 as an example, two multipliers and one adder are included. The multiplier-accumulator 40 may be configured to receive and calculate a product of input signals a1 and b1 and a product of input signals a2 and b2, and then perform summation. A computation result of the multiplier-accumulator 40 may be input to a corresponding gating circuit 10 and a select circuit 11. The select circuit 11 selectively provides a signal to the adder 41 to perform computation according to a demand.

In a first mode, through a selection of the select circuit 11, the computation result of the multiplier-accumulator 40 may be provided to the adder 41 after passing through the gating circuit 10, and then the computation result may be finally output through the gating circuit 12. In a second mode, through the selection of the select circuit 11, the computation result of the multiplier-accumulator 40 may be provided to the adder 41 in a condition where the gating circuit 10 is bypassed, and then the computation result may be finally output through the gating circuit 12.

Therefore, the pipeline circuit 4 may provide an operation selection of the first mode and the second mode at the same time. When operating in the first mode, a higher timing constraint demand may be met. When operating in the second mode, since a pre-stage gating circuit 10 is bypassed and properly blocked, there may be no signal toggling, and since a driving frequency is lower, the gating circuit 12 may also consume lower power. Therefore, in summary, the pipeline circuit 4 may have lower power consumption in the second mode.

FIG. 5 is a flow chart of a pipeline operating method according to an embodiment of the disclosure. The pipeline operating method in FIG. 5 may be applied to, for example, any one of the pipeline circuits in FIGS. 1, 2, and 4. The pipeline operating method in FIG. 5 includes steps S50, S51, and S52.

In step S50, a gating circuit 12 may receive an input signal and selectively output the input signal as an output signal. Further, step S50 further includes the step S51 or the step S52 to operate in the first mode or the second mode. In step S51, in the first mode, the gating circuit 12 may receive the input signal that has been gated to output as the output signal. In step S52, in the second mode, the gating circuit 12 may receive the input signal to output as the output signal.

Specifically, for detailed operation contents of the pipeline operating method, please refer to the foregoing paragraphs related to operation descriptions for the pipeline circuit 1, 2, or 4, which will not be described again here.

Based on the above, the pipeline circuit and the pipeline operating method of the disclosure can provide a variety of operation modes. The disclosure meets a variety of timing demand, and provides options for low power consumption operation at the same time.

What is claimed is:

1. A pipeline circuit, comprising:
   a plurality of multiplier-accumulators, configured to receive a plurality of input signals, and perform summation of the plurality of input signals to generate a computation result;
   a plurality of pre-stage gating circuits, wherein the computation results of the plurality of multiplier-accumulators is input to a corresponding pre-stage gating circuit;
   a plurality of select circuits, each of the plurality of select circuits being coupled to a corresponding pre-stage gating circuit and the corresponding multiplier-accumulator,
   wherein, an output end of the multiplier-accumulator is coupled to a first input end of the respective pre-stage gating circuit and a first input end of the respective select circuit, a second input end of the select circuit is coupled to an output end of the respective one of the plurality of pre-stage gating circuits;
   an adder, in which an input of the adder is coupled to the outputs of the plurality of select circuits;
   a gating circuit, coupled to an output of the adder, and output an output signal at an output end,
   wherein in a first mode, the gating circuit receives a signal corresponding to the computation result that has been gated by the plurality of pre-stage gating circuits to output as the output signal; and
   wherein in a second mode, the gating circuit receives a signal corresponding to the computation result that bypasses the plurality of pre-stage gating circuits to output as the output signal.

2. The pipeline circuit according to claim 1, wherein in the first mode, both the pre-stage gating circuit and the gating circuit receive a first clock signal at respective clock ends,
   wherein in the second mode, the clock end of the pre-stage gating circuit is blocked, and the clock end of the gating circuit receives a second clock signal.

3. The pipeline circuit according to claim 2, wherein a frequency of the first clock signal is higher than a frequency of the second clock signal.

4. A pipeline operating method, comprising:
   perform summation of the plurality of input signals by a multiplier-accumulator to generate a computation result;
   inputting the computation result of the multiplier-accumulator to a corresponding pre-stage gating circuit and a corresponding select circuit;
   selectively providing a signal to an adder by the corresponding select circuit to perform computation;
   receiving an input signal by a gating circuit coupled to an adder, and selectively outputting the input signal as an output signal,
   wherein in a first mode, the input signal that has been gated by a plurality of pre-stage gating circuits respectively coupled to the plurality of multiplier-accumulators is received by the gating circuit to output as the output signal; and
   wherein in a second mode, the input signal that bypasses the plurality of pre-stage gating circuits is received by the gating circuit to output as the output signal.

5. The pipeline operating method according to claim 4, comprising coupling an output end of the pre-stage gating circuit to an input end of the gating circuit in the first mode by a select circuit, and coupling an input end of the pre-stage gating circuit to the input end of the gating circuit in the second mode by the select circuit.

6. The pipeline operating method according to claim 5, comprising: in the first mode, providing a first clock signal to clock ends of the pre-stage gating circuit and the gating circuit, and in the second mode, blocking the clock end provided to the pre-stage gating circuit, and providing a second clock signal to the clock end of the gating circuit.

7. The pipeline operating method according to claim 6, wherein a frequency of the first clock signal is higher than a frequency of the second clock signal.

* * * * *